United States Patent [19]
Takehara

[11] Patent Number: 5,393,695
[45] Date of Patent: Feb. 28, 1995

[54] METHOD OF MAKING SOLAR CELL

[75] Inventor: Nobuyoshi Takehara, Nagahama, Japan

[73] Assignee: Canon Kabushiki Kaisha, Tokyo, Japan

[21] Appl. No.: 214,547

[22] Filed: Mar. 18, 1994

Related U.S. Application Data

[62] Division of Ser. No. 957,150, Oct. 7, 1992, Pat. No. 5,318,638.

[30] Foreign Application Priority Data

Oct. 18, 1991 [JP] Japan .................. 3-271033

[51] Int. Cl.$^6$ .......................................... H01L 31/18
[52] U.S. Cl. ................................. 437/180; 437/2; 437/4; 437/5; 437/181; 437/188
[58] Field of Search ........................ 437/2, 4–5, 437/180–181, 188; 136/256

[56] References Cited

U.S. PATENT DOCUMENTS

| | | | |
|---|---|---|---|
| 4,084,985 | 4/1978 | Evans | 136/251 |
| 4,968,354 | 11/1990 | Nishimura et al. | 136/244 |

FOREIGN PATENT DOCUMENTS

| | | | |
|---|---|---|---|
| 3804831 | 7/1989 | Germany | 136/256 |
| 59-167056 | 9/1984 | Japan | 136/256 |
| 59-167057 | 9/1984 | Japan | 136/256 |
| 59-168669 | 9/1984 | Japan | 136/256 |
| 63-185071 | 7/1988 | Japan | 136/256 |
| 1-124270 | 5/1989 | Japan | 136/256 |
| 1-149484 | 6/1989 | Japan | 136/256 |
| 2-117177 | 5/1990 | Japan | 136/256 |
| 2-298079 | 5/1990 | Japan | 136/256 |
| 3-38069 | 2/1991 | Japan | 136/256 |

OTHER PUBLICATIONS

K. A. Baert et al., "Amorphous–Silicon Solar Cells with Screen–Printed Metallization", IEEE Trans. Elec. Dev., vol. 37, No. 3, 3/199, pp. 702–707.
Patent Abstracts of Japan, vol. 12, No. 461 (E–689) Dec. 5, 1988 and JP 63–185071, Jul. 30, 1988.
Patent Abstracts of Japan, vol. 13, No. 264 (E–774) Jun. 19, 1989 and JP 1–057762, Mar. 6, 1989.
Patent Abstracts of Japan, vol. 9, No. 19 (E–292) Jan. 25, 1985 and JP 59–167056, Sep. 20, 1984.
Patent Abstracts of Japan, vol. 9, No. 19 (E–292) Jan. 25, 1985 and JP 59–167057, Sep. 20, 1984.
Patent Abstracts of Japan, vol. 9, No. 19 (E–292) Jan. 25, 1985 and JP 59–168669, Sep. 22, 1984.

*Primary Examiner*—Aaron Weisstuch
*Attorney, Agent, or Firm*—Fitzpatrick, Cella, Harper & Scinto

[57] ABSTRACT

A solar cell has a photoelectric conversion semiconductor layer and an electrode made of a material containing a conductive base material and a resin binder electrically connected to the photoelectric conversion semiconductor layer, wherein the volume of voids in the electrode having a diameter of 0.1 $\mu$m or greater is 0.04 ml/g or less.

5 Claims, 9 Drawing Sheets

METHOD OF MAKING SOLAR CELL

This application is a division of application Ser. No. 07/957,150, filed Oct. 7, 1992, U.S. Pat. No. 5,318,638, issued Jun. 7, 1994.

BACKGROUND OF THE INVENTION

1. Field of the Invention

The present invention relates to a solar cell for use as a power supply for a variety of electronic equipment or a power source for a power plant. More particularly, the invention relates to a solar cell having an improved electrode structure with excellent resistance to the environment. Also, it relates to a solar cell which has a cheap, flexible, and durable electrode grid.

2. Related Background Art

In recent years, there has been growing interest in the environment and energy sources because of global warming and radioactive pollution due to atomic power plant accidents. In view of these situations, solar cells have been expected to be exploited as a reproducible, inexhaustible source of clean energy. At present, three types of solar cells are well known: single crystal silicon, polycrystalline silicon, and amorphous silicon. The amorphous silicon type solar cell has excellent characteristics such as its thin film construction, which permits easy realization of large area cells, and a large light absorption coefficient, unlike the crystal type solar cells, even though it is inferior in conversion efficiency to the crystal type solar cell. Thus, the amorphous silicon type solar cell is one of the more promising types of solar cells. Since its cost is estimated to be significantly less than the crystal types if production reaches several hundreds of MW, many studies on it have been performed throughout the world. An example of a conventional amorphous silicon type solar cell is shown in FIG. 2. A photoelectric conversion semiconductor layer 103 made of amorphous silicon is formed on an electrically conductive substrate 104, and a transparent electrically conductive layer 102 also useful as an antireflection layer is formed thereon. On the transparent electrically conductive layer there is formed a grid electrode 101 as a current collector. If light 106 is incident on the photoelectric conversion layer 103 from the grid electrode 101, as shown in FIG. 2, light energy is converted into electric current within the conversion layer 103, and outputted through the transparent electrically conductive layer 102 via the grid electrode 101 and the electrically conductive substrate 104. The photoelectric conversion layer 103 contains at least one or more pin or pn junctions, with the p side acting as the anode and the n side as the cathode.

When the solar cell is used outdoors, particularly good characteristics with respect to environmental resistance are required. However, studies by the present inventor have revealed that in a conventional grid electrode, a short-circuit may take place between the electrodes of the solar cell due to water permeating voids in the electrode, which is one of the causes of a decrease in the conversion efficiency. For example, a conventional grid electrode is disclosed in Japanese Laid-Open Patent Application Nos. 59-167056, 59-167057, and 59-168669. Specifically, as described in Japanese Laid-Open Patent Application No. 59-167056, the grid electrode is constituted of a conductive paste composed of 80 wt % silver and 20 wt % phenolic resin binder, but it is poor in durability and the void volume (as shown at 105 in FIG. 2) may increase with time. With such an electrode, it is difficult to produce a solar cell having no degradation of conversion efficiency when exposed to the environment. This aspect will be described later in detail.

In general, a solar cell having an output of several W or greater is used outdoors. Therefore, so-called "environment proof" characteristics with respect to the temperature and humidity are required. Particularly in a solar cell having a grid electrode as a collector, a conductive material such as silver or the like contained in the grid electrode may dissolve by the permeation of water (as shown with $Ag_2O$ in FIG. 3) and by the photoelectromotive force of the material, diffuse through defective portions such as pinholes or exfoliations. This causes a short-circuit between the positive and negative electrodes of the solar cell, thereby greatly decreasing the conversion efficiency. For example, when the conductive base material is silver, the reaction proceeds between the anode and the cathode according to the following formula, thereby giving rise to a short-circuit.

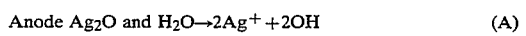
Anode $Ag_2O$ and $H_2O \rightarrow 2Ag^+ + 2OH$ (A)

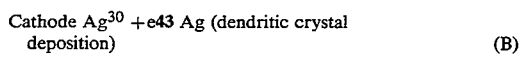
Cathode $Ag^{30} + e43$ Ag (dendritic crystal deposition) (B)

This behavior is shown in FIG. 3. A silver ion 305 arising from a positive-side collector electrode 101 enters a pinhole 306 existing in the photoelectric conversion semiconductor layer 103 due to an electric field produced by the absorption of light, and adheres to the conductive substrate 104 to form a dendritic type crystal 307. If the dendritic crystal grows, the collector electrode 101 of the solar cell is electrically shorted to the conductive substrate 104, so that the output of the solar cell is reduced. Consequently, degradation of the conversion efficiency may occur.

SUMMARY OF THE INVENTION

In light of the aforementioned drawbacks, an object of the present invention is to provide a solar cell which is high in environmental resistance and unlikely to degrade in conversion efficiency.

The above object of the present invention is accomplished by a solar cell having a photoelectric conversion semiconductor layer and an electrode made of a material containing a conductive base material and a resin binder electrically connected to the photoelectric conversion semiconductor layer, wherein the volume of voids in the electrode having a diameter of $0.1\mu$ or greater is 0.04 ml/g or less.

According to the present invention, water is prevented from entering voids existing in the electrode and thus eroding and breaking the electrode, so that excellent photoelectric conversion efficiency of the solar cell can be maintained for a long time.

The photoelectric conversion semiconductor layer for use in the present invention may be single crystal semiconductor layer, a polycrystal semiconductor layer, or an amorphous semiconductor layer as a non-single crystal semiconductor layer, or a crystalline semiconductor layer. Specific examples include silicon, germanium, carbon, silicon-germanium, silicon carbide, CdSe, CdSeTe, CdTeAs, ZnSe, GaAs or the like. In order to generate the photoelectromotive force, a pn junction, pin junction, Schottky junction, hetero junction or the like is formed, using such a photoelectric conversion semiconductor layer.

The electrode for use in the present invention is disposed directly or via another layer interposed therebetween on at least one face of the above photoelectric conversion semiconductor layer.

The electrode for use in the present invention will be described below, but to facilitate the understanding of the contents of the art, an example of the solar cell according to the present invention will be described in which amorphous silicon deposited on a conductive substrate is used as the photoelectric conversion semiconductor layer.

An amorphous silicon layer having at least one pin junction is formed on a flat conductive substrate by plasma CVD using a silane gas. The conductive substrate may be a plate or sheet of stainless, aluminum, copper, titanium, or a carbon sheet or the like. Also, the substrate may be a resin substrate having metal or the like deposited thereon.

On such substrate, a transparent conductive layer composed of indium oxide, tin oxide or the like is formed by vapor deposition, spraying, or the like. Further, a conductive paste containing a conductive base material and a resin binder is applied on the transparent conductive layer by screen printing or relief printing, and cured at a temperature of 100° to 200° C., whereby a grid electrode as a current collector is attached. In order to constitute the solar cell of the present invention, it is significantly important to select or adjust the conductive paste according to the following criteria found by the present inventor as a result of extensive studies.

(1) The amount of solvent contained in the conductive paste should be as little as possible.
(2) A resin binder containing the least amount of volatile component arising in crosslinking of the resin should be used.

The solar cell of the present invention can be constituted by using a paste meeting the above criteria found by the present inventor. In most cases, the conductive paste contains a solvent such as carhydroacetate, butylcellulobuzo-acetate or polyhydric alcohol, or the like, but this solvent will increase the void volume in the grid, and is preferably present in as little quantity as possible and most preferably is a solventless type paste.

The relation between the solvent weight percent and the void volume is shown in FIG. 6. From FIG. 6, it can be found that the void volume decreases with decreasing solvent weight percent.

Examples of the conductive base material include silver, silver-palladium alloy, a mixture of silver and carbon, copper, nickel, aluminum, gold, and mixtures thereof. To obtain a conductivity necessary for passing electric current through a grid electrode, the conductive base material is preferably contained at 70 wt %, and more preferably at 75 wt % or greater. Preferable examples of the binder resin include urethanes, epoxies, polyimides, polyesters, phenols, vinyls, acrylics, and the like. Particularly, epoxies are most preferable from the viewpoints of waterproofing and economy. The curing temperature of the conductive paste is preferably as high as possible in order to raise the density of crosslinking of the resin, but since too high a temperature will burn the resin and thereby increase the gap volume, it should be appropriately selected and set within the range of accomplishing the objects of the present invention. For example, for urethane or epoxy type resins, it is desirably 200° C. or less. Also, to secure a certain density of crosslinking, it is desirable to cure the resin at at least 100° C. or greater for more than 10 minutes. Since impurities such as chlorine, sodium, or the like contained in the conductive paste will facilitate the creation of silver ions as the catalyst in such an electromigration reaction, it is preferable that it contain the least amount of impurities possible.

Next, the electrode for use in the present invention and the voids therein will be described in detail.

DETAILED DESCRIPTION OF THE PREFERRED EMBODIMENTS

Figure 1:
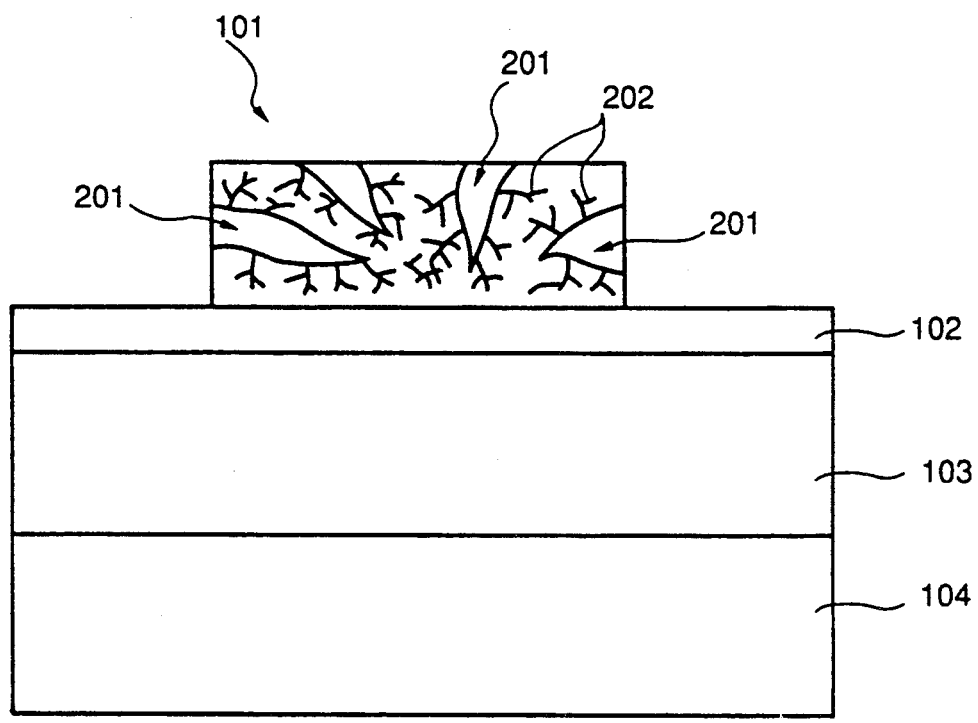
FIG. 1 is a cross-sectional schematic view of a solar cell for explaining a solar cell according to the present invention.
Figure 2:
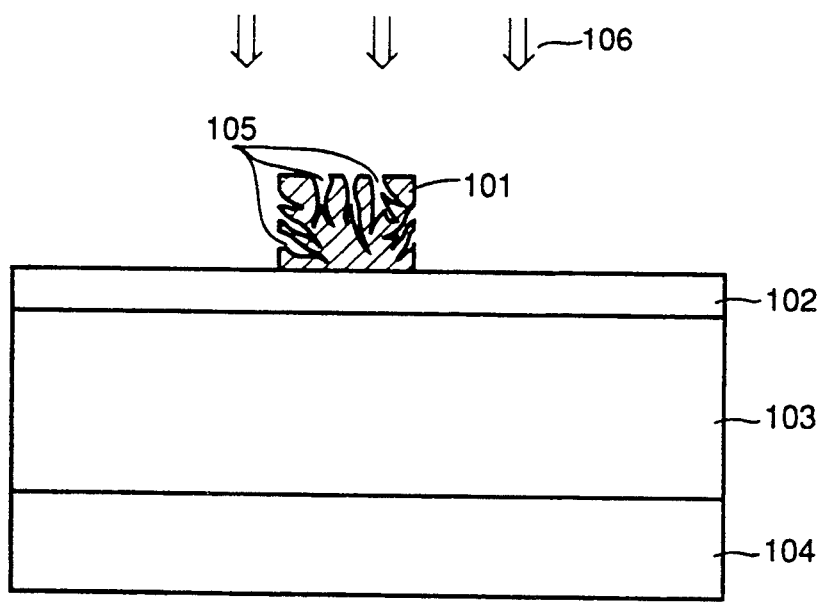
FIG. 2 is a cross-sectional schematic view of a conventional solar cell.
Figure 3:
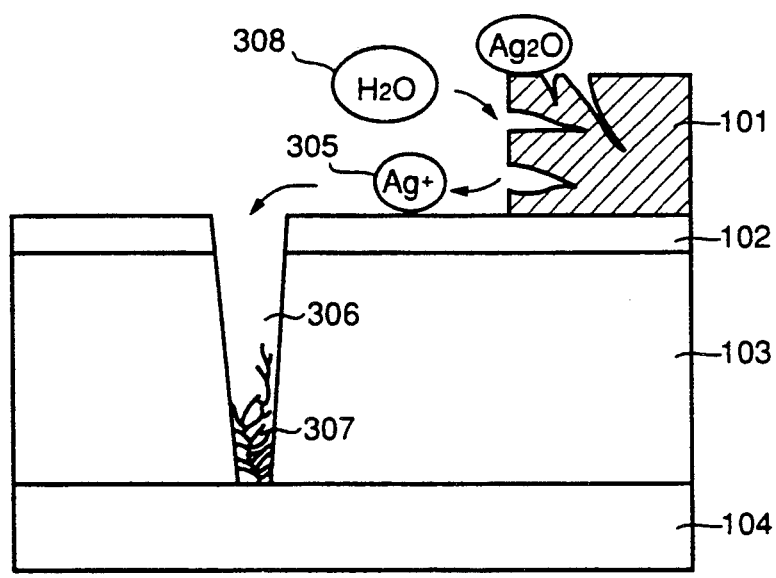
FIG. 3 is a cross-sectional schematic view for explaining the principle of degradation in the conventional solar cell.

Referring now to FIG. 1, a collector electrode 101 is provided on a transparent conductive layer formed on a photoelectric conversion semiconductor layer 103 which is itself formed on a substrate 104.

Herein, reference numeral 201 indicates relatively large voids having a diameter of, for example, $0.1\mu$ or greater, and reference numeral 202 indicates relatively small voids having a diameter of, for example, less than $0.1\mu$.

According to the present inventor, since water flows through the large voids 201 into the voids 202 where the micro-reaction may occur, it is possible to substantially prevent water from entering therein if the volume of the voids 201 is as small as 0.04 ml/g or less.

The shape of the voids is such that the shape of the openings on the electrode surface and the cross-sectional shape within the electrode may be any one ranging from a polygon to a circle, an ellipse, a triangle, or a quadrangle. Each void may or may not communicate with one another.

The void diameter and volume as defined in the present invention can be obtained in the following way.

Based on the principle of capillary action, liquid which does not produce wetting, and thus indicates a contact angle from 90° to 180° to most substances, will not enter a pore unless force is applied, and will enter the pore in accordance with the applied pressure and the size (diameter) of the pore, so that the volume of mercury permeating the pore can be measured by the diameter of the pore and the work used to force the mercury into the pore as a function of the applied pressure. With this mercury porosimetry, the diameter and the volume of voids in the grid electrode can be obtained.

According to the present invention, if the pore or void volume having a diameter of $0.1\mu$ or greater in the electrode is 0.04 ml/g or less, and more preferably 0.02 ml/g or less, it is difficult for water to reach the conductive base material, whereby reaction according to the previously described formula (A) does not occur, and thus the creation of silver ions is prevented. No short-circuits are formed, so that the conversion efficiency is not degraded.

Figure 7:
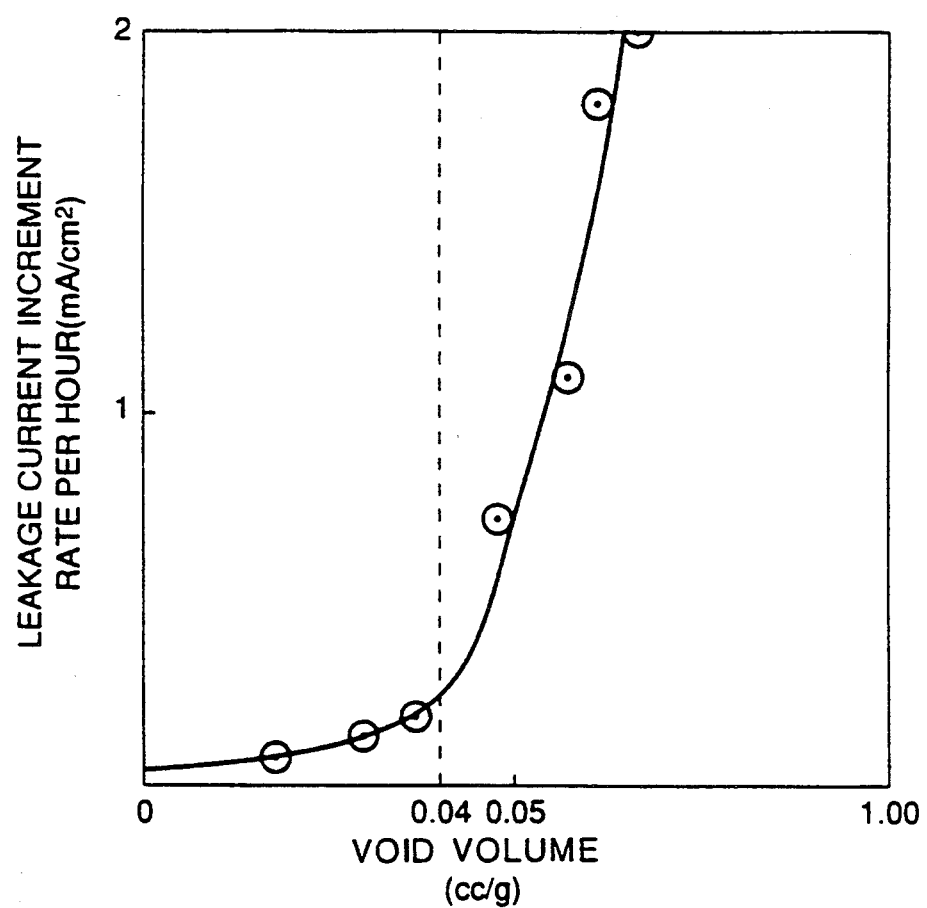
FIG. 7 is a view showing the decreasing leakage current increment rate per hour with the reduced void volume.

FIG. 7 shows the relation between the void volume and the leakage current increment rate per hour, which indicates that the leakage current increment rate per hour is advantageously small when the void volume is 0.04 ml/g or less.

Figure 8:
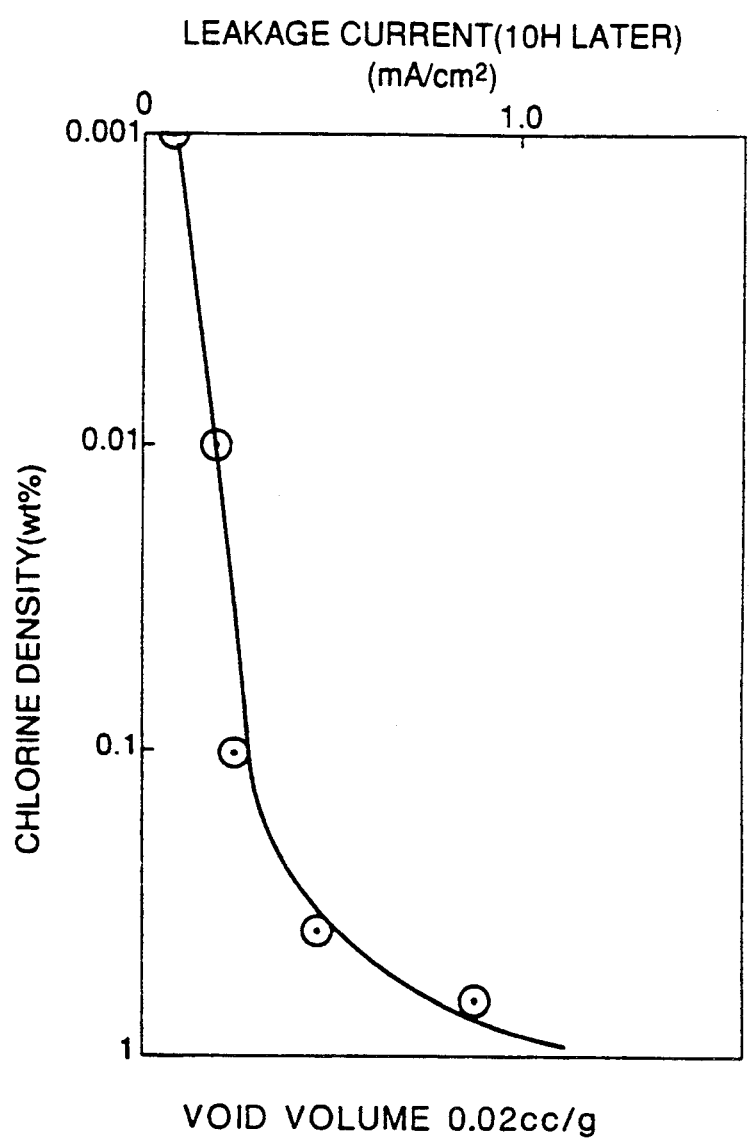
FIG. 8 is a view showing the improvement in the leakage current with decreasing chlorine concentration.
Figure 9:
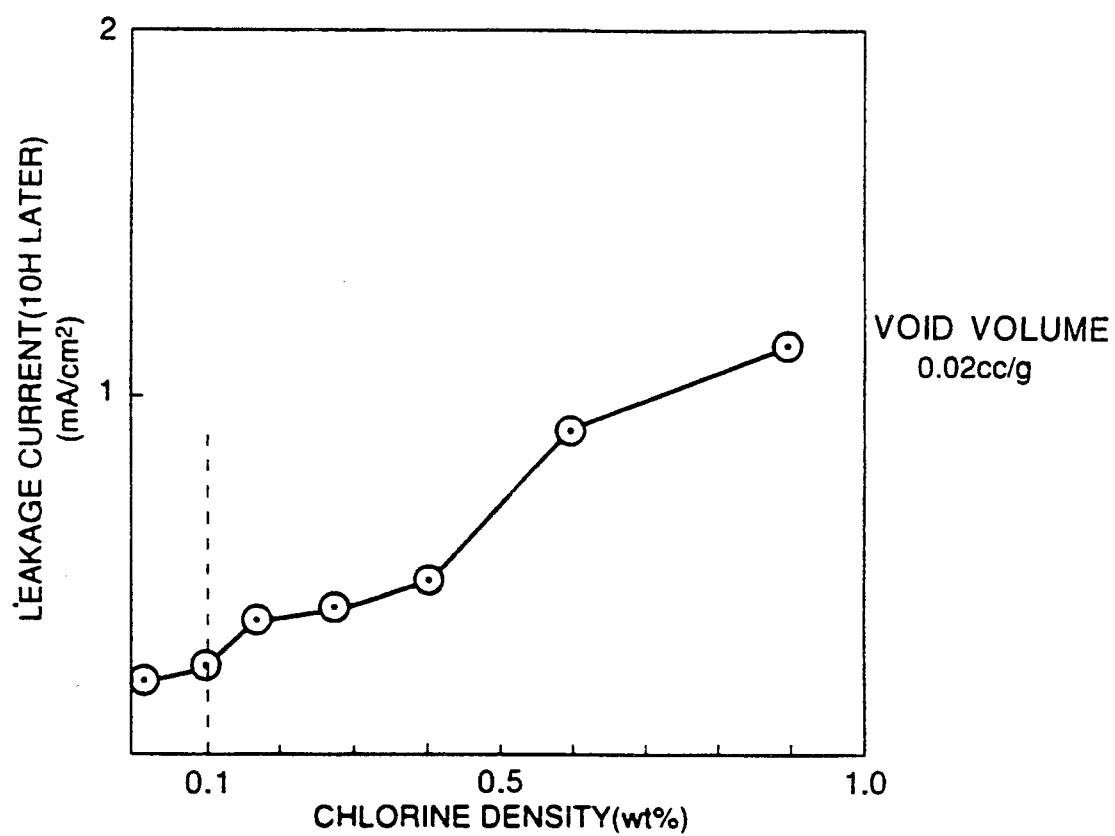
FIG. 9 is a view showing the improvement in the leakage current with decreasing chlorine concentration.

FIG. 8 shows the leakage current after 10 hours, with the void volume being 0.02 ml/g, when a forward bias is applied under the conditions of high temperature and high humidity, and the concentration (density) of chlorine is changed. FIG. 9 shows an enlarged portion thereof.

From FIGS. 8 and 9, it is indicated that the smaller the concentration of chlorine contained as impurities in the electrode, the less the leakage of current after 10 hours, and particularly in a range of 0.10 wt % or less of chlorine impurity, the leakage current is quite small and particularly good.

According to the present invention, it is possible to provide a solar cell having a photoelectric conversion semiconductor layer and an electrode made of a material containing a conductive base material and a resin electrically connected to the photoelectric conversion semiconductor layer, in which the short-circuit between solar cell electrodes due to water permeation can be prevented, and the environmental resistance is excellent, owing to the facts that:

(1) the volume of voids in the electrode having a diameter of $0.1\mu$ or greater is 0.04 ml/g or less, or
(2) the volume of voids in the electrode having a diameter of 20 Å or greater is 0.04 ml/g or less, or
(3) the weight percent of the conductive base material in the grid electrode is 70% or greater, or
(4) the resin binder is made of urethane, epoxy, or polyimide type, or
(5) the concentration of chlorine contained in the electrode as impurities is 0.1 wt % or less.

Since a mixture of resin binder and conductive base material is used for the grid, the grid is attached at a low temperature, so that the solar cell can be fabricated inexpensively.

Since the grid having a resin binder is bendable and durable to mechanical impact, it is possible to provide a flexible and durable solar cell.

The preferred examples of the present invention will now be described in detail.

EXAMPLE 1

A plurality of photoelectric conversion layers composed of amorphous silicon were deposited on a stainless substrate having a thickness of 8 mils and an area of 16 cm$^2$ by plasma CVD, and a transparent conductive layer composed of indium oxide was adhered thereto by sputtering.

Then, a conductive paste composed of a urethane type resin binder and silver particulates (70 wt % conductive base material, 18 wt % solvent, 12 wt % resin binder) was screen printed, and cured at a temperature of 130° C. for one hour to form a solar cell of the present invention. The total volume of voids having a diameter of 20 Å or greater in the grid electrode measured by mercury porosimetry was 0.036 ml/g, while the volume of voids having a diameter of $1\mu$ or greater was 0.018 ml/g.

Figure 4:
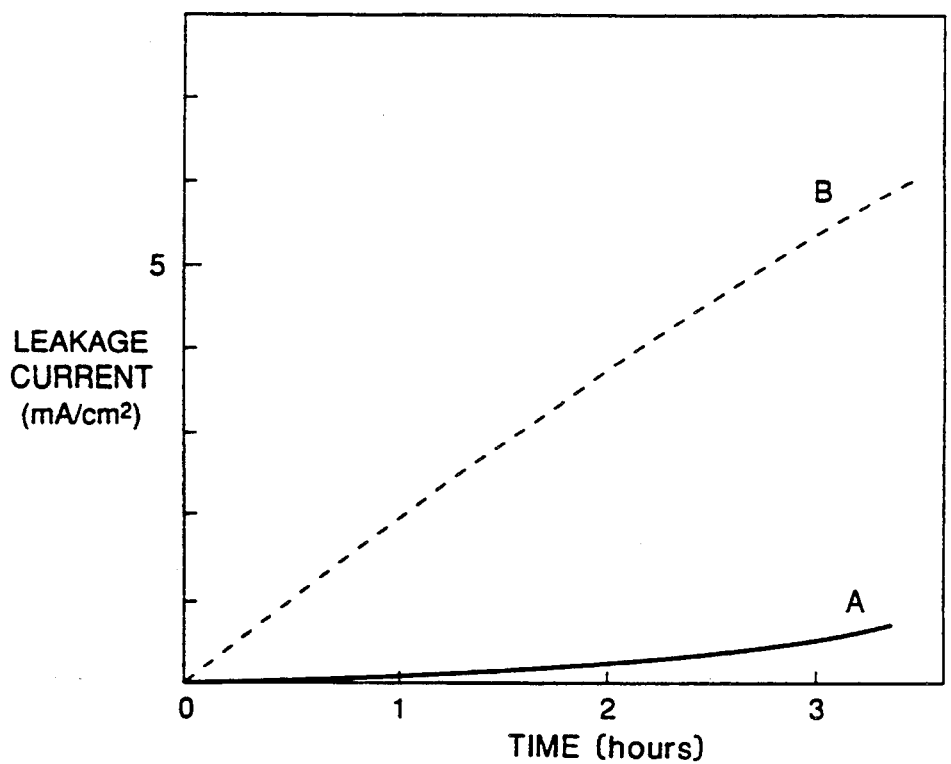
FIG. 4 is a graph showing the result of Example 1.

A forward bias of 1.2 V was applied to this solar cell under the conditions of high temperature of 85° C. and a high humidity of 85% RH to measure the leakage current flowing within the solar cell. The forward bias was applied to simulate the operational state. The leakage current increment rate was 0.2 mA/cm$^2$ or less per hour, and it was found that elution of silver was greatly decreased. This behavior is graphically shown in FIG. 4. The ordinate of FIG. 4 indicates the leakage current value per unit area, and the abscissa indicates time. The leakage current increment in this example is indicated by the solid line A. The dashed line indicates the leakage current increment of Comparative Example 1 as next described.

Comparative Example 1

As a comparative example, the same test as above was performed using a conductive paste composed of a polyester type resin binder and silver particulates (70 wt % conductive base material, 25 wt % solvent, 5 wt % resin binder). The total volume of voids having a diameter of 20 Å or greater measured in the same way as Example 1 was 0.065 ml/g, while the volume of voids having a diameter of $0.1\mu$ or greater was 0.046 ml/g. The leakage current increment rate reached 2.0 mA/cm$^2$ per hour.

Comparative Example 2

The same test as in Example 1 was performed using a conductive paste composed of a vinyl type resin binder and silver particulates (70 wt % conductive base material, 22 wt % solvent, 8 wt % resin binder). The total volume of voids having a diameter of 20 Å or greater was 0.060 cc/g, while the volume of voids having a diameter of 0.1 $\mu$m or greater was 0.041 cc/g. The leakage current increment rate was 1.8 mA/cm$^2$ per hour.

EXAMPLE 2

Figure 5:
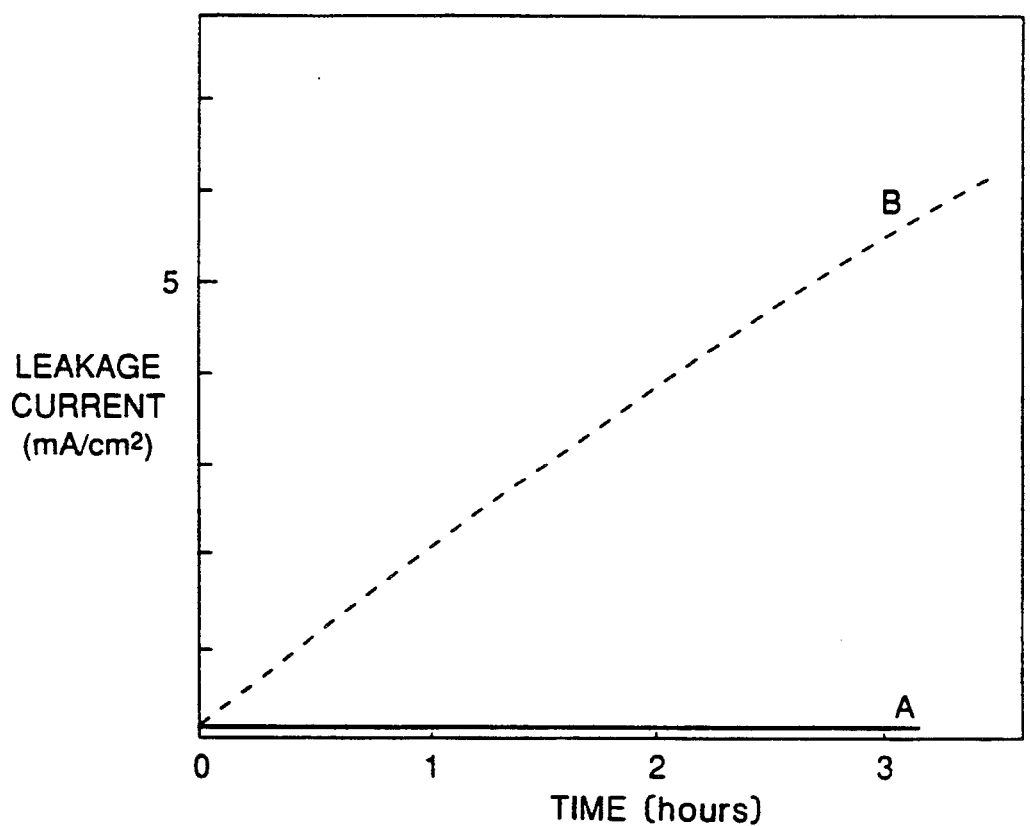
FIG. 5 is a graph showing the result of Example 2.
Figure 6:
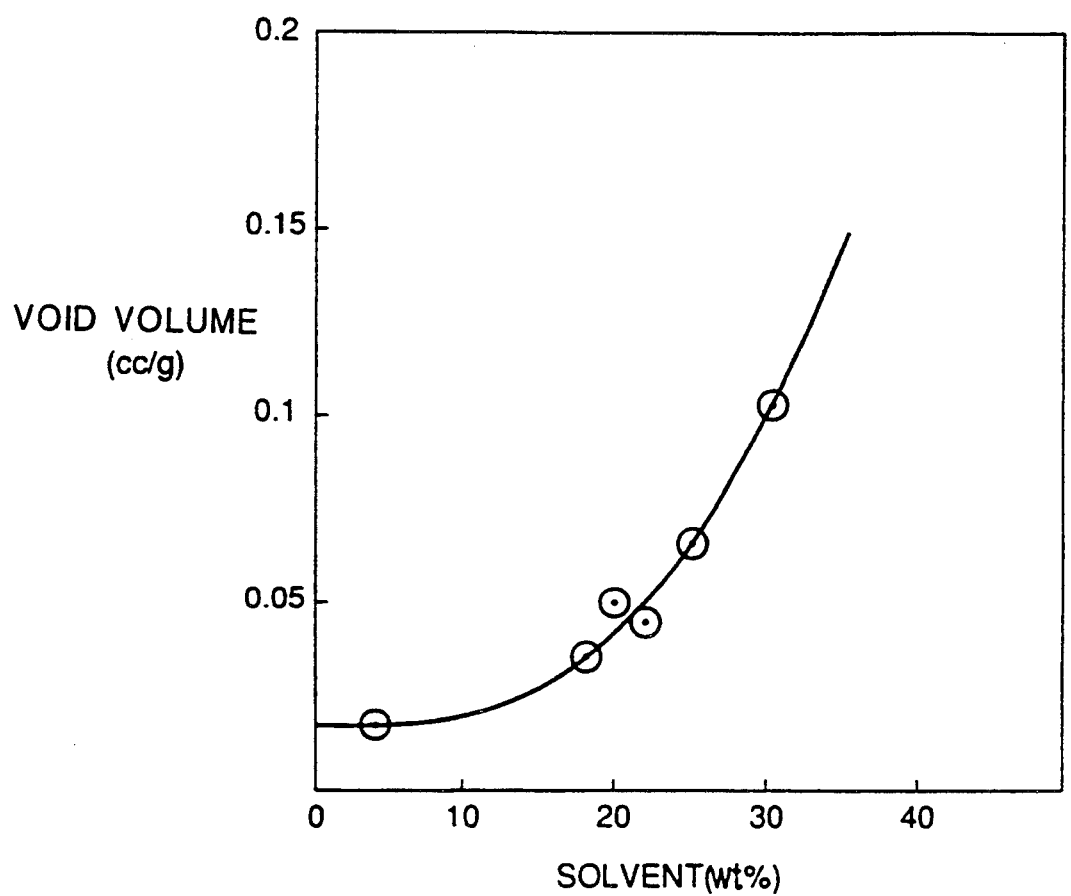
FIG. 6 is a view showing the reduction in the void volume with decreasing weight % of solvent.

In the same way, a solar cell was fabricated using a conductive paste composed of an epoxy type resin binder and silver particulates (80 wt % conductive base material, solventless). The curing condition was 150° C. for 3 hours. The total volume of voids having a diameter of 20 Å or greater was 0.018 cc/g, while the volume of voids having a diameter of 1 $\mu$m or greater was 0.030 cc/g. This is due to the fact that no solvent is contained and the epoxy type resin binder has a very small amount of volatile materials arising during crosslinking. Further, in the same way as in Example 1, a forward bias was applied to this solar cell under the conditions of a high temperature of 85° C. and a high humidity of 85% RH to measure the leakage current increment. This result is shown in FIG. 5 together with that of Comparative Example 1. In FIG. 5, the solid line A indicates the leakage current in this example, while the dashed line B indicates the leakage current of Comparative Example 1. In this example, the leakage current increment rate was 0.03 mA/cm$^2$ per hour, which was about 1/100 of that of the comparative example. It is indicated that this value is about 1/10 that of Example 1, and a great effect can be obtained by using such a conductive paste having a small amount of volatile material arising during curing.

EXAMPLE 3

Using solventless epoxy type pastes A and B both including 75 wt % of a conductive base material and 25 wt % of a resin binder, with impurities mixed in A and impurities removed in B, tandem-type amorphous solar cells A and B were fabricated by the same method as in Example 1. As a result of measurement by mercury porosimetry, the total volume of voids having a diameter of 20 Å or greater was 0.016 cc/g in A and 0.018 cc/g in B. Also, the volume of voids having a diameter of 1 μm or greater was almost the same for both A and B, i.e., 0.003 cc/g. The concentration of chlorine in the electrode was 0.01 wt % in A, but it could not be detected in B. The measurement method was ion exchange chromatography. The detection limit of the equipment used was 0.001 wt %.

In the same way as in the previous example, a forward bias was applied to this solar cell under the conditions of high temperature and high humidity to measure the leakage current. The initial leakage current was 0.06 mA/cm$^2$ for both. The leakage current after 10 hours was 0.2 mA/cm$^2$ in A and 0.07 mA/cm$^2$ in B. This indicates that the degradation rate will depend on the concentration of chlorine.

The present invention can provide a solar cell excellent in environmental resistance, wherein the short-circuits between the electrodes due to water permeation can be prevented by using a grid electrode in which the volume of voids having a diameter of 0.1 μm or greater is 0.04 cc/g or less.

Further, the grid can be attached at a low temperature because of the use of a resin binder and a conductive base material for the grid, whereby the solar cell can be fabricated inexpensively.

Further, since the grid having the resin binder is bendable and durable to mechanical impact, it is possible to provide a flexible and durable solar cell.

As above described, according to the present invention, it is possible to provide a solar cell excellent in environmental resistance at a lower cost, so that its industrial value is quite large.

Although the present invention has been described with reference to the specific examples, it should be understood that various modifications and variations can be easily made by those skilled in the art without departing from the spirit of the invention. Accordingly, the foregoing disclosure should be interpreted as illustrative only and is not to be interpreted in a limiting sense. The present invention is limited only by the scope of the following claims.

What is claimed is:

1. A method of fabricating a solar cell comprising a photoelectric conversion semiconductor and an electrode comprising a conductive base substance and a resin binder, said electrode electrically connected to said photoelectric conversion semiconductor, said method comprising the steps of:
   forming a conductive paste comprising said conductive base substance and said resin binder in which the amount of solvent contained therein is adjusted so as to be not more than 18 wt % based on the weight of the conductive paste, whereby the volume of voids in said electrode having a diameter of 0.1 μm or greater is 0.04 cc/g or less;
   applying said conductive paste to a surface of said photoelectric conversion semiconductor; and
   forming said electrode by curing said conductive paste.

2. The method according to claim 1, wherein said semiconductor is a non-single crystalline semiconductor.

3. The method according to claim 1, wherein chlorine is contained in said electrode in amounts of 0.1 wt. % or less.

4. The method according to claim 1, wherein in the electrode forming step, said conductive paste is thermally cured.

5. The method according to claim 4, wherein the temperature of said thermal curing is from 100° C. to 200° C.

* * * * *

UNITED STATES PATENT AND TRADEMARK OFFICE
CERTIFICATE OF CORRECTION

PATENT NO. : 5,393,695

DATED : February 28, 1995

INVENTOR : NOBUYOSHI TAKEHARA

It is certified that errors appear in the above-identified patent and that said Letters Patent is hereby corrected as shown below:

On the title page:
[56 References Cited

Foreign Patent Documents, "2-298079 5/1990 Japan" should read --2-298079 12/1990 Japan--.

COLUMN 2

Line 24, "2OH" should read --$2OH^-$--; and

Line 25, --Cathode $AG^{30}$ +e43 Ag" should read --Cathode $Ag^+ + e^- \rightarrow Ag$--.

Signed and Sealed this

Fourth Day of July, 1995

Attest:

BRUCE LEHMAN

Attesting Officer

Commissioner of Patents and Trademarks